United States Patent
Yoshikawa et al.

(10) Patent No.: US 7,914,898 B2
(45) Date of Patent: Mar. 29, 2011

(54) RESIN-COATED METAL PLATE FOR USE IN PERFORATING PRINTED-WIRING BOARD

(75) Inventors: Eiichiro Yoshikawa, Kobe (JP); Naoya Fujiwara, Kobe (JP); Yasuhiro Okamura, Narashino (JP)

(73) Assignees: Kabushiki Kaisha Kobe Seiko Sho, Hyogo (JP); Sun Aluminium Industries, Ltd., Chiba (JP)

( * ) Notice: Subject to any disclaimer, the term of this patent is extended or adjusted under 35 U.S.C. 154(b) by 154 days.

(21) Appl. No.: 11/003,498

(22) Filed: Dec. 6, 2004

(65) Prior Publication Data

US 2005/0145123 A1    Jul. 7, 2005

(30) Foreign Application Priority Data

Dec. 9, 2003 (JP) ................. 2003-410779

(51) Int. Cl.
- *B32B 15/04* (2006.01)
- *B32B 27/00* (2006.01)
- *H05K 3/10* (2006.01)

(52) U.S. Cl. ............. 428/457; 428/461; 29/846; 29/847

(58) Field of Classification Search .................. 428/457, 428/458, 461; 29/846, 847
See application file for complete search history.

(56) References Cited

U.S. PATENT DOCUMENTS

| | | | |
|---|---|---|---|
| 4,507,342 A * | 3/1985 | Kielbania, Jr. ............... | 428/90 |
| 4,781,495 A | 11/1988 | Hatch et al. | |
| 4,929,370 A | 5/1990 | Hatch et al. | |
| 6,753,300 B2 * | 6/2004 | Eziri et al. ................. | 508/100 |
| 6,794,022 B2 * | 9/2004 | Fujiwara et al. ............. | 428/217 |
| 2002/0003991 A1 * | 1/2002 | Ohashi et al. ............... | 408/87 |
| 2002/0037400 A1 * | 3/2002 | Fujiwara et al. ............. | 428/330 |

FOREIGN PATENT DOCUMENTS

| | | | |
|---|---|---|---|
| JP | 7-50831 | | 8/1986 |
| JP | 01244849 A | * | 9/1989 |
| JP | 02024012 A | * | 1/1990 |
| JP | 06228379 A | * | 8/1994 |
| JP | 07221451 A | * | 8/1995 |
| JP | 2000-218599 | | 1/1999 |
| JP | 2001-150215 | | 11/1999 |
| JP | 2001-246696 | | 3/2000 |
| JP | 2002-120198 | | 10/2000 |
| JP | 2002-154094 A | | 11/2000 |
| JP | 2003-080498 A | | 6/2001 |
| JP | 2002-292599 A | | 11/2001 |
| JP | 2003-209335 A | | 1/2002 |
| JP | 2003318554 | * | 11/2003 |
| JP | 2004-017190 A | * | 1/2004 |
| WO | 01/47657 A1 | * | 7/2001 |

OTHER PUBLICATIONS

Boedeker Plastics: polyehtylene database (www.boedeker.com/polye_p.htm).*

* cited by examiner

*Primary Examiner* — Kevin R. Kruer

(74) *Attorney, Agent, or Firm* — Stites & Harbison PLLC; Juan Carlos A. Marquez, Esq.

(57) ABSTRACT

The present invention provides a resin-coated metal plate suitable as a cover plate for use in perforating a printed-wiring board with a drill, capable of effectively preventing the heat generation of drill bits and the scattering of chips while sufficiently performing lubrication and discharging the chips, to highly efficiently form a high-quality perforated-hole with excellent smoothness of the inner wall thereof while reducing the risk of breakage of the drill and eliminating any surface tackiness to achieve excellent operating performance and storage stability. The resin-coated metal plate of the present invention comprising a metal base plate, and a film made of a thermoplastic resin and formed on at least one of the opposite surfaces of said metal base plate to cover thereover, said thermoplastic resin being substantially water-insoluble, wherein said thermoplastic resin has: a melting peak temperature measured according to JIS K7121 ranging from 60° C. to 120° C.; a melt viscosity ranging from $1 \times 10^3$ P to $1 \times 10^4$ P under a shear rate of 200 mm/sec, and from $5 \times 10^2$ P to $5 \times 10^3$ P under a shear rate of 3000 mm/sec, in the state when said thermoplastic resin is molten at 150° C.; and a durometer D hardness measured according to JIS K7215 ranging from 20 to 45.

14 Claims, No Drawings

RESIN-COATED METAL PLATE FOR USE IN PERFORATING PRINTED-WIRING BOARD

BACKGROUND OF THE INVENTION

1. Field of the Invention

The present invention relates to a resin-coated metal plate suitable as a cover plate for efficiently obtaining a high-quality product in a perforating process as one of the production processes for a printed-wiring board, and a printed-wiring board production method including a perforating process using the resin-coated metal plate.

2. Description of the Related Art

A printed-wiring board plays a role in electrically connecting between a plurality of electronic components mounted (or packaged) thereon, and its role as an internal component for electric products is of significant importance. As one of the processes for producing such a printed-wiring board, there has been known a perforating process for forming a through-hole in a multilayer printed-wiring board in its cross-sectional direction so as to provide an electrical conduction between the uppermost and lowermost layers of the board. In addition to the essentiality of the through-hole to the printed-wiring board, it is generally required to form the through-hole in a large number. Therefore, the perforating process occupies an important position in the production of printed-wiring boards.

Typically, a printed-wiring board comprises a composite material with a laminated structure which includes a conductive layer formed of a copper foil, and an insulative layer prepared by impregnating a cross-web of woven glass fibers with epoxy resin and curing the epoxy resin. The respective materials of these layers are different in physical properties, and thereby it is liable to cause defects, such as boundary separation between the layers or cracks, during drilling, which undesirably lead to deterioration in surface roughness of the inner wall of a perforated hole, and wearing or breakage of a drill. In addition, the front surface of the printed-wiring board having periodic irregularities derived from dents in the glass-fiber cross-web is liable to cause deterioration in positional accuracy of a drilled hole during a perforating process using a drill. Moreover, the resin in the printed-wiring board is softened due to heat generated during the perforating process using a drill, and adhered to the inner layer or copper foil in the form of a stain, so-called drill smear, which will be one of factors causing defective electrical conduction after plating of through-holes.

Particularly, in connection with downsizing and elaboration in electronics devices, a perforated hole to be formed in a printed-wiring board is progressively reduced in diameter, and increased in density or narrowed in hole pitch. Thus, it becomes essential to provide technologies allowing a perforated hole to be formed at a more accurate position with an inner wall having enhanced surface smoothness. Further, in view of the need for cutting a production cost due to recent economic circumstances, it is strongly urged to establish more efficient production technologies for printed-wiring boards.

As a technique for suppressing heat generation during perforating to solve the above problem, U.S. Pat. Nos. 4,781,495 and 4,929,370 disclose a method of perforating a multilayer printed-circuit board with a drill, through the use of a cover plate comprising a water-soluble-lubricant-impregnated sheet disposed on one or both of the opposite surfaces of the multilayer board. The lubricant-impregnated sheet for use in this perforating method is prepared by impregnating a porous material, such as paper, with a mixture of glycol, such as diethylene glycol or dipropylene glycol, which is a solid water-soluble lubricant, a synthetic wax, such as fatty acid, and nonionic surfactant.

Japanese Patent Laid-Open Publication No. 2002-120198 discloses a method of perforating a multilayer printed-circuit board with a drill, through the use of a cover plate comprising a water-soluble resin-coated metal plate prepared by adhering a mixture a polycondensation product of polyethylene glycol and dimethyl terephthalate, and polyoxymethylene monostearate, which are a water-soluble compound onto one of the surfaces of the aluminum plate.

An improvement of the above techniques includes a method of perforating a multilayer printed-wiring board while disposing a thermoplastic film having a melting temperature of 100° C. to 150° C., directly on the copper foil. (Japanese Patent publication No. 07-050831) Other improvement includes a method of perforating a printed-wiring board while stacking a sheet on the printed-wiring board. The sheet is prepared by bonding a metal foil and a thermoplastic resin film with a multilayer structure including a lubricant-containing thermoplastic resin layer and a no-lubricant thermoplastic resin layer laminated on the outer surface of the lubricant-containing thermoplastic resin layer. (Japanese Patent Laid-Open Publication No. 2001-150215) Further, a method using a sheet with a laminated structure including a metal foil and a polyester resin composition prepared by mixing inorganic filler and/or water-soluble lubricant with thermoplastic polyester resin is proposed. (Japanese Patent Laid-Open Publication Nos. 2001-246696 and 2000-218599).

However, none of the above techniques provides sufficient advantages to the need for forming a hole at a more accurate position with an inner wall having enhanced surface smoothness, in the process of perforating a printed-wiring board with a drill.

For example, the aforementioned method of perforating a printed-circuit board with a drill, through the use of a cover plate comprising a water-soluble lubricant-impregnated sheet or a water-soluble resin-coated metal plate disposed on the printed-circuit board, can definitely offer a certain level of advantage in preventing the heat generation in the drill, providing reduced roughness in the inner surface of a perforated portion of the printed-wiring board, and achieving extended life of the drill. On the other hand, the method has disadvantages in insufficient impregnation of the mixture serving as an essential component of the sheet to the porous material, deterioration in the adhesion between the metal plate and the water-soluble resin, occurrence of warping or bending in the resin-coated metal plate, and poor handling or operating performance due to surface tackiness of the resin-coated metal plate, particularly under high-temperature and high-humidity conditions, such as rainy season or summer season, caused by sticky properties of the film itself. The inventor's experience in the researches for improving these problems by means of the addition of inorganic powder filler has shown that the tackiness of the film caused by moisture absorption or exposure to water is particularly an intrinsically inevitable problem in the technique using a film comprising a primary component of water-soluble resin.

In the aforementioned technique of mixing lubricant with thermoplastic resin, even if it is designed such that a no-lubricant thermoplastic resin layer is additionally laminated on the bonded portion of the lubricant-containing resin layer to the metal foil, it will be liable to cause deterioration in the adhesion between the additional resin layer and the metal foil, because the lubricant will be diffused in the bonded portion between the additional resin layer and the metal foil, with time. As a result, chips formed during perforating are likely to enter between the additional resin layer and the metal foil so as to deteriorate the positional accuracy of a perforated hole, and a drill is likely to be broken due to insufficient discharge of the chips.

The thermoplastic resin disclosed in the aforementioned Japanese Patent Laid-Open Publication No. 2001-150215 has a high hardness, which leads to significant deterioration in positional accuracy of a perforated hole due to slipping of a drill onto the board during perforating.

Accordingly, as a solution of the above problems, a coated resin which has properties suitable for a perforating process using a drill has been desired.

SUMMARY OF THE INVENTION

It is an object of the present invention to provide a resin-coated metal plate for use in perforating a printed-wiring board with a drill, which is free from the problems residing in the prior art.

Through various researches on films serving as one of the components of a cover plate for use in a perforating process, a cover plate achieving the above object can be obtained, particularly, by appropriately adjusting the physical properties of thermoplastic resin for use as the film.

According to an aspect of the present invention, a resin-coated metal plate comprises a metal base plate, and a film made of a thermoplastic resin and formed on at least one of the opposite surfaces of said metal base plate to cover thereover, said thermoplastic resin being substantially water-insoluble, wherein said thermoplastic resin has: a melting peak temperature measured according to JIS K7121 ranging from 60° C. to 120° C.; a melt viscosity ranging from $1 \times 10^3$ poise (hereinafter, referred to as P) to $1 \times 10^4$ P under a shear rate of 200 mm/sec, and from $5 \times 10^2$ P to $5 \times 10^3$ P under a shear rate of 3000 mm/sec, in the state when said thermoplastic resin is molten at 150° C.; and a durometer D hardness measured according to JIS K7215 ranging from 20 to 45.

This resin-coated metal plate can effectively prevent the heat generation of drill bits and the scattering of chips while sufficiently performing lubrication and discharging the chips, to highly efficiently form a high-quality perforated-hole with excellent smoothness of the inner wall thereof while reducing the risk of breakage of the drill, and eliminating any surface tackiness to achieve an excellent operating performance, particularly under drilling conditions where a plurality of through-holes are drilled at a narrow distance between adjacent perforated holes (at a narrow hole pitch) or in a high density.

These and other objects, features and advantages of the present invention will become more apparent upon reading of the following detailed description.

DESCRIPTION OF THE PREFERRED EMBODIMENTS

A preferred embodiment for achieving the features of the present invention and its effects will now be described.

In a resin-coated metal plate of the present invention, the thermoplastic resin constituting the film is required to be "substantially water-insoluble". If the film is made of a water-soluble resin, it will have a tacky surface under high-temperature and high-humidity circumstances to cause difficulties in maintaining storage stability of finished resin-coated metal plates due to the adhesion between the finished resin-coated metal plates during storage or transportation thereof. Moreover, the film having a primary component of a water-soluble resin has poor adhesiveness relative to the metal base plate, and poor operating performance due to bending or warping of a resin-coated metal plate caused by a large difference between the respective water absorptions of the resin film and the metal base plate. The term "substantially water-insoluble" herein means that a thermoplastic resin serving as at least the matrix of the film is water-insoluble, or the thermoplastic resin in the present invention may have water solubility to the extent that the above effects e.g., storage stability of finished resin-coated metal plates, can be achieved. Therefore, a resin-coated metal plate having a thermoplastic resin film partly containing an additional water-soluble component, such as an additive, e.g. oxidation inhibitor, or inevitable impurities or contaminants, is encompassed within the scope of the present invention.

When the resin-coated metal plate of the present invention is used as a cover plate during a process for perforating a printed-wiring board with a drill, the thermoplastic resin covering a surface of the metal base plate will be a molten resin having an appropriate viscosity due to frictional heat caused by drilling. The molten resin enters into a perforated hole along with penetration of the drill, while acting as a lubricant and a chip-discharging medium, so as to enhance the surface smoothness of the inner wall of the drilled hole, and prevent chips from remaining on the front surface of the cover plate after drilling, or prevent the breakage of the drill, particularly, in the high-density drilling to be performed at a narrow hole pitch, to provide a perforated hole excellent in positional accuracy and inner-wall smoothness. These effects can be achieved by using the thermoplastic resin which has an appropriate melting point allowing its molten state to be induced by the frictional heat and an appropriate melt viscosity and hardness in the molten state, and covering it on the metal base plate.

This melting point is required to be "a melting peak temperature measured according to JIS K7121 ranging from 60° C. to 120° C.". If the melting peak temperature is less than 60° C., a part or all of the resin film will be molten or softened during storage or transportation, particularly, in summer season or tropical region, to cause problems, such as the adhesion between resin-coated metal plates. On the other hand, if the melting peak temperature becomes greater than 120° C., the resin film will be hardly molten by the generated frictional heat, or will have an excessively high melt viscosity even if its molten state is induced, so that it will not be able to achieve the desired lubricating and chip-discharging effects during drilling. In order to achieve these desired effects, the lower limit of the melting peak temperature is set preferably at 65° C. or more, more preferably at 70° C. or more, and the upper limit of the melting peak temperature is set preferably at 110° C. or less, more preferably at 100° C. or less.

The melt viscosity of the thermoplastic resin is required to fall within the range "from $1 \times 10^3$ P to $1 \times 10^4$ P under a shear rate of 200 mm/sec, and from $5 \times 10^2$ P to $5 \times 10^3$ P under a shear rate of 3000 mm/sec, in the state when the thermoplastic resin is molten at 150° C.".

In this requirement of the melt viscosity, the shear rate defining the melt viscosity is set at "200 mm/sec and 3000 mm/sec" by the following reasons. Generally, the melt viscosity of a thermoplastic resin exhibits non-Newtonian properties wherein a higher shear rate provides a lower melt viscosity even under the same temperature condition. Further, in a process for perforating a printed-wiring board with a drill having a small diameter (dia.: 0.1 mm to 0.4 mm), there are cases where the perforating process is performed at a high drill speed of several ten thousand to several hundred thousand, and thereby a shear rate in a contact surface with the drill during drilling is extremely high. For example, in a perforating process using a drill with a diameter of 0.3 mm at a drill speed of 150,000 rpm, a relative shear rate between a perforated hole and the surface of the rotating drill would be increased up to 2355 mm/sec. Thus, the melt viscosity should be set to have an appropriate value under such a high-shear condition.

In addition to the above high-shear condition, the melt viscosity should also be set to have an appropriate value under a low-shear condition. Specifically, in an actual perforating process, while the high-shear condition occurs at a drill speed of several hundred thousand, a time-period where an actually rotating drill is in contact with the resin layer of the resin-coated metal plate is not more than about $2/100$ seconds in view of the penetration speed of a drill (typically, 1.0 to 4.0 m/min). In order to induce the molten state of the resin within this short time-period and exhibit the lubricating effect, it is essential to set the melt viscosity on the assumption that the perforating process is performed at a lower drill speed (e.g., 15,000 rpm, wherein a relative shear rate to a drill is about 235 mm/sec). If the melt viscosity is set to have a value appropriate at a lower drill speed (or lower shear rate), the molten resin entering into a perforated hole along with penetration of the drill will exhibit further enhanced lubricating and chip-discharging functions so as to prevent chips from remaining on the front surface of the cover plate after drilling to eliminate the risk of breakage of the drill, particularly, in the high-density drilling to be performed at a narrow hole pitch, and provide a desired perforated hole excellent in positional accuracy and inner-wall smoothness. In view of the above points, the melt viscosity in the present invention is defined not only under a high-shear condition (i.e., 3000 mm/sec) but also under a low-shear condition (i.e., 200 mm/sec).

The reason why the melt viscosity is defined under each of the above shear conditions as follows: "from $1 \times 10^3$ P to $1 \times 10^4$ P under a shear rate of 200 mm/sec, and from $5 \times 10^2$ P to $5 \times 10^3$ P under a shear rate of 3000 mm/sec" is in that a melt viscosity deviated from this range causes increased surface roughness in the inner wall of a drilled hole, particularly, in the high-density drilling to be performed at a narrow hole pitch, deterioration in positional accuracy of the drilled hole due to increased chips remaining on the front surface of the cover plate after drilling, and increased risk of breakage of the drill.

More specifically, if the viscosity of the molten resin becomes greater than $5 \times 10^3$ P, particularly, under a high-shear condition (i.e., 3000 mm/sec), the resin in its molten state will hardly enter into a perforated hole together with a drill, or the amount of the molten resin to be associated with the drill will be reduced, to cause insufficient lubrication. Moreover, the chip-discharging performance will be deteriorated to cause damages in the inner wall of the perforated hole, and accumulation of chips on the front surface of the cover plate. These adverse affects lead to increased risks of deterioration in inner-wall smoothness and positional accuracy of the perforated hole, and breakage of the drill.

On the other hand, if the viscosity of the molten resin is less than $1 \times 10^3$ P, particularly, under a low-shear condition (i.e., 200 mm/sec), the molten resin attached to the drill will be apt to undesirably drop on the front surface of the resin-coated metal plate when the drill is pulled out of a completely drilled hole and then moved to the subsequent drilling position. The molten resin dropping on the front surface of the cover plate is attached onto the front surface of the resin-coated metal plate as a foreign object. Thus, if the portion of the cover plate having the attached resin is drilled, the drilled hole will be liable to have significantly deteriorated positional accuracy, and the risk of breakage of the drill will be increased. These problems can be a fatal defect, particularly, in the high-density drilling to be performed at a narrow hole pitch.

Further, "150° C." defined as the measurement condition of the melt viscosity is determined based on the temperature of a land (conductive pattern) heated by a frictional heat generated within $10/100$ seconds from a start time of a perforating process to be performed under typical drilling conditions.

The hardness of the thermoplastic resin is required to be "a durometer D hardness measured according to JIS K7215 ranging from 20 to 45". If the durometer D hardness becomes greater than 45, a through-hole will be drilled with significantly deteriorated position accuracy. On the other hand, if the durometer D hardness becomes less than 20, the resin-coated metal plate will be liable to cause so-called "blocking phenomenon", that when a plurality of resin-coated metal plates are stacked up or rolled in a coil form, the resin-coated metal plates are bonded to one another, resulting in significant deteriorations in productivity and storage stability. The lower limit of the durometer D hardness is set preferably at 25 or more, more preferably at 30 or more, and the upper limit of the durometer D hardness is set preferably at 40 or less, more preferably at 35 or less.

In the durometer hardness test procedure for plastics (JIS K7215), there are two types of durometers: A-type and D-type. While a durometer D hardness is employed in the present invention, the hardness of the thermoplastic resin can also be expressed by a durometer A hardness because a durometer D hardness has a certain correlation with a durometer A hardness. For example, a durometer D hardness of 50 corresponds to a durometer A hardness of 95, and a durometer D hardness of 10 corresponds to a durometer A hardness of 50.

Preferably, the thermoplastic resin film covering a surface of the metal base plate has a thickness ranging "from 20 μm to 300 μm". If the thickness is less than 20 μm, the lubricating and chip-discharging effects will be likely to be achieved insufficiently. On the other hand, if the thickness becomes greater than 300 μm, the resulting excessive resin will be likely to cause significant deterioration in positional accuracy of a perforated hole or breakage of a drill. The lower limit of the thickness of the film is more preferably 25 μm or more, particularly preferably 50 μm or more, and the upper limit of the thickness of the film is more preferably 250 μm or less, particularly preferably 200 μm or less.

Preferably, the metal base plate has a thickness ranging "from 20 μm to 300 μm". If the thickness is less than 20 μm, the cover plate will have a deteriorated handling performance which is likely to cause deterioration in positional accuracy of a drilled hole during drilling, and accumulation of chips between a printed-wiring board and the cover plate. On the other hand, the metal base plate having a thickness of greater than 300 μm is likely to impose restrictions on productivity and cause poor cost-effectiveness. The lower limit of the thickness of the base metal is more preferably 50 μm or more, particularly preferably 70 μm or more, and the upper limit of the thickness of the base metal is more preferably 250 μm or less, particularly preferably 200 μm or less.

In the resin-coated metal plate of the present invention, the metal base plate is preferably formed of an aluminum-base plate (i.e., aluminum plate or aluminum alloy plate). Specifically, while the material of the base plate may include pure aluminum series, and aluminum alloy, such as 3000 series aluminum alloy or 5000 series aluminum alloy, it is most preferable to use pure aluminum series. These aluminum-base plates having an appropriate hardness and strength may be used as a cover plate for a perforating process to suppress the occurrence of burrs and other irregularities and prevent the degradation of a drill.

Preferably, the thermoplastic resin film is "laminated on the metal base plate through either one selected from the group consisting of a dry laminating process, a wet laminating process and a hot laminating process". According to these laminating processes, the thermoplastic resin film can be readily formed on the metal base plate while controlling the thickness of the film.

The bonding between the thermoplastic resin film and the metal base plate may be made using a conventional adhesive. For example, a commercially available adhesive for a dry laminating process includes acrylic-based adhesives, urethane-based adhesives and ester-based adhesives, and a commercially available adhesive for a hot laminating process includes ethylene-vinyl acetate copolymer resin-based adhesives, olefin-based adhesives and rubber-based adhesives. An appropriate adhesive may be selected from these adhesives depending on an intended laminating process.

In the present invention, the thermoplastic resin constituting the resin film is not limited to a specific chemical structure and a specific type, as long as it meets the aforementioned requirements of the melting peak temperature, the melt viscosities under the specific shear conditions, and the durometer D hardness. For example, the thermoplastic resin may include amide-based elastomer, butadiene-based elastomer, ester-based elastomer, olefin-based elastomer, urethane-based elastomer, styrene-based elastomer, polybutene, low-density polyethylene, chlorinated polyethylene, metallocene-based polyolefin resin, ethylene-acrylic ester-maleic anhydride copolymer, ethylene-glycidyl (metha) acrylate copolymer, ethylene-vinyl acetate copolymer resin, modified ethylene-vinyl acetate copolymer resin, ethylene-(metha) acrylate copolymer, ionomer resin, and ethylene-(metha) acrylate ester copolymer resin. One or more of these resins may be selectively used as the thermoplastic resin independently or in combination, and any other resin having the properties of the above resins may be used in the same manner. That is, the resin for the film in the resin-coated metal plate of the present invention is not required to newly synthesize a resin having a specific chemical structure, but the film may be made of one of any commercially available resins having the properties falling within the scope of the present invention or their mixtures. The properties of each of the commercially available resins or their mixtures may be measured to quickly determine whether it is suitable as a resin film of a resin-coated metal plate for use in perforating a printed-wiring board.

In the present invention, the opposite surfaces of the metal base plate may not be coated with the thermoplastic resin, and may be covered by a releasable resin film comprising a resin composition containing a silicone-based compound. If a plurality of resin-coated metal plates each having only one surface coated with the thermoplastic resin are stored or transported together, storage stability will be likely to be unable to be maintained due to the adhesion between the exposed metal side of one resin-coated metal plate and the resin film side of another resin-coated metal plate. In contrast, the resin-coated metal plate having one surface coated with the releasable resin film can suppress the occurrence of the above adhesion to provide enhanced storage stability.

The resin-coated metal plate is used as a protective cover plate to be disposed on at least a drill entry surface of a workpiece consisting of a single printed-wiring board or a plurality of laminated printed-wiring boards. While there has been known a cover plate to be used in this manner, the resin-coated metal plate of the present invention used as a cover plate in a process for perforating a printed-wiring board with a drill can exhibit excellent effects of suppressing heat generation of drill bits, preventing the scattering of chips, and discharging chips, so as to efficiently produce a printed-wiring board with a perforated hole having excellent surface smoothness of its inner wall. In addition, the resin-coated metal plate of the present invention can provide an extended life of a drill to be used in the perforating process.

While the present invention will be described in more detail below by showing specific examples and test samples, the present invention is not limited thereto.

EXAMPLES

Inventive Example 1

A film having a thickness of 100 µm was prepared using ethylene-ethyl acrylate copolymer resin (EVAFLEX-EEA, Grade: A-701, Resin Code A in Table 1, available from Du Pont-Mitsui Polychemicals Co., Ltd.). The film was laminated on a pure aluminum plate (1050-H18) having a thickness of 100 µm, using a dry-laminating adhesive (LX-901, available from Dainippon Ink And Chemicals, Inc.) to prepare a resin-coated metal plate for use in perforating a printed-wiring board, as shown in Table 2. The ethylene-ethyl acrylate copolymer resin had a melting peak temperature of 98° C., a durometer hardness of D 40, and melt viscosities of $9.0 \times 10^3$ P (under a shear rate of 200 mm/sec) and $2.5 \times 10^3$ P (under a shear rate of 3000 mm/sec), at 150° C.

Inventive Example 2

A film having a thickness of 100 µm was prepared using a mixture (Resin Code B in Table 2) obtained by mixing ethylene-vinyl acetate copolymer resin (EVAFLEX-EV310, available from Du Pont-Mitsui Polychemicals Co., Ltd.) and ethylene-acrylic acid copolymer resin (PRIMACOR 5990 I, available from Dow Chemical Co.) at the mass ratio of 7:3. The film was laminated on a pure aluminum plate (1050-H18) having a thickness of 100 µm, using a dry-laminating adhesive (LX-901, available from Dainippon Ink And Chemicals, Inc.) to prepare a resin-coated metal plate for use in perforating a printed-wiring board. The resin B had a melting peak temperature of 73° C., a durometer hardness of D 30, and melt viscosities of $4.5 \times 10^3$ P (under a shear rate of 200 mm/sec) and $1.5 \times 10^3$ P (under a shear rate of 3000 mm/sec), at 150° C.

In the same manner as that in Inventive Example 1, various types of resins (Resin Codes C to G) described in Table 1 were used to prepare resin-coated metal plates for use in perforating a printed-wiring board, as shown in Table 2.

Comparative Example 1

A film having a thickness of 100 µm was prepared using polyethylene (Sumikasen L211, Resin Code H in Table 1, available from Sumitomo Mitsui Polyolefin Co.). The film was laminated on a pure aluminum plate (1050-H18) having a thickness of 100 µm to prepare a resin-coated metal plate for use in perforating a printed-wiring board, as shown in Table 3. The polyethylene had a melting peak temperature of 113° C., a durometer hardness of D 49, and melt viscosities of $7.5 \times 10^4$ P (under a shear rate of 200 mm/sec) and $1.0 \times 10^4$ P (under a shear rate of 3000 mm/sec), at 150° C.

Comparative Example 2

In the same manner as that in Comparative Example 1, various types of resins (Resin Codes I to M) described in Table 1 were used to prepare resin-coated metal plates for use in perforating a printed-wiring board, as shown in Table 3.

Referential Example 1

Three types of films having thicknesses of 10, 100 and 300 μm were prepared using ethylene-ethyl acrylate copolymer resin (EVAFLEX-EEA, Grade: A-701, Resin Code A in Table 1, available from Du Pont-Mitsui Polychemicals Co., Ltd.). Each of the films was laminated on one of three types of pure aluminum plates (1050-H18) having thicknesses of 10, 100 and 300 μm to prepare resin-coated metal plates for use in perforating a printed-wiring board, as shown in Table 4.

Evaluation Method of Resin Properties

The water solubility, melting point, melt viscosity and hardness of each resin prepared in Inventive Examples, Comparative Examples and Referential Examples were evaluated by the following methods.

(1) Water Solubility

Pellet-shaped resins weighted on a scale were immersed in distilled water having a weight 20 times of the resins, and the mixture was stirred at 20° C. for 30 minutes. Then, the obtained solution was visually observed. The remaining pellets in the solution were collected by filtration, and weighted on a scale after dried. The resin having less than 3% of reduction in weight between before and after the immersion in the water was determined as "No" or water-insoluble, and the resin having 3% or more of reduction in weight or completely dissolved in the water without collected pellet was determined as "Yes" or water-soluble.

(2) Melting Point

The melting point of a resin was measured based on JIS K7121 (plastic transition-temperature measuring method).

Specifically, the "plastic transition-temperature measuring method" was performed by enclosing about 5 mg of resin in an aluminum sample pan, and measuring the heat quantity of the resin using a differential scanning calorimeter (DSC, DSC7 available from PerkinElmer Inc.) while heating the resin from 25° C. to 250° C. at a heating rate of 10° C./min under a nitrogen gas atmosphere. In an obtained calorimetric curve, a region where the line gets away from a base line and then returns to the base line was defined as a melting peak, and a temperature at the top of the melting peak was defined as the melting peak temperature of the resin (represented as "Melting Point" in Table 1).

(3) Melt Viscosity

The melt viscosity of a resin was measured using a dynamic viscoelasticity measurement apparatus ARES available from TA Instruments Co. Ltd.

In this measuring method, a resin heated up to its melting temperature or more and maintained in its molten state was first inserted between two parallel discs each having a diameter of 25 mm, and the distance between the discs was adjusted at 2.0 mm. Then, one of the discs swept the resin at an angular rate of 0.1 to 500 radian/sec to apply a shear stress to the resin, and a angular rate dependence of the melt viscosity of the resin was measured based on the changes in stress and phase detected from the other disc, while gradually reducing the temperature of the resin. The melt viscosity was measured under a shear rate ranging from 20 mm/sec to 3000 mm/sec at a melting temperature of 150° C.

In the above measurement conditions, an angular rate of 32 radian/sec provides a shear rate of 200 mm/sec, and an angular rate of 480 radian/sec provides a shear rate of 3000 mm/sec.

(4) Hardness

The hardness of a resin was measured based on JIS K7215 (plastic durometer-hardness measuring method). Specifically, the "plastic durometer-hardness measuring method" was performed by preparing a resin formed to have a square shape of 100×100 mm and a thickness of 6 mm, pressing a D-type durometer onto the resin by a load of 5 kg at a room temperature (23° C.), and reading a maximum value of an indicator in the pressed durometer to measure the durometer D hardness of the resin based on the maximum value.

The resin properties measured by the above methods are shown in Table 1.

TABLE 1

| Resin Code | Resin Type | Water Solubility | Melting Point (° C.) | Melt Viscosity 1 | Melt Viscosity 2 | Hardness |
|---|---|---|---|---|---|---|
| A | ethylene-ethyl acrylate copolymer resin | No | 98 | 9000 | 2500 | D40 |
| B | ethylene-vinyl acetate copolymer resin and ethylene-acrylic acid copolymer resin | No | 73 | 4500 | 1500 | D30 |
| C | ethylene-methacrylate copolymer resin | No | 61 | 7000 | 1500 | D43 |
| D | low-density polyethylene | No | 117 | 10000 | 5000 | D43 |
| E | ethylene-vinyl acetate copolymer resin and ethylene-acrylic acid copolymer resin | No | 65 | 1000 | 550 | D35 |
| F | ethylene-vinyl acetate copolymer resin | No | 75 | 10000 | 4500 | D20 |
| G | ethylene-vinyl acetate copolymer resin | No | 97 | 9000 | 5000 | D45 |
| H | low-density polyethylene | No | 113 | 25000 | 9000 | D49 |
| I | polyethylene glycol and ethylene-acrylic acid copolymer resin | YES | 63 | 800 | 400 | D55 |
| J | ethylene-vinyl acetate copolymer resin and ethylene-acrylic acid copolymer resin | No | 75 | 9000 | 6000 | D18 |
| K | ethylene-ethyl acrylate copolymer resin and paraffin wax | No | 68 | 900 | 500 | D16 |
| L | ethylene-vinyl acetate copolymer resin | No | 58 | 7000 | 1500 | D19 |
| M | modified ethylene-vinyl acetate copolymer resin | No | 122 | 10000 | 4500 | D42 |

In Table 1, "Melt Viscosity 1" indicates a melt viscosity under a shear rate of 200 mm/sec at 150° C., and "Melt Viscosity 2" indicates a melt viscosity under a shear rate of 3000 mm/sec at 150° C.

Test Results

The resin-coated metal plates prepared as Inventive Examples, Comparative Examples and Referential Examples were perforated with a drill to evaluate the positional accuracy of a perforated hole, the surface roughness of the inner wall of the perforated hole, the protect against breakage of the drill, and the surface tackiness of the film.

In advance of drilling, the resin-coated metal plate was disposed to locate the resin-coated surface on the drill entry side. Seven printed-wiring boards (formed of FR-4) each having a thickness of 0.4 mm and a copper foil (thickness: 18 µm) on the respective opposite surfaces thereof were stacked up, and disposed under the resin-coated metal plate. The backup board made of bakelite (thickness: 1.5 mm) was placed under the printed-wiring board. Then, the printed-wiring boards were perforated with a drill.

The drilling was performed under the following two types of conditions.

(Condition 1)
Drill Bit: 0.3 mm diameter
Speed: 125,000 rpm
Feed Rate: 2.5 m/min
Distance between the centers of adjacent perforated holes (hole pitch): 0.5 mm
Number of penetration: 5000 hits
(Condition 2)
Drill Bit: 0.3 mm diameter
Speed: 125,000 rpm
Feed Rate: 2.5 m/min
Distance between the centers of adjacent perforated holes: 0.8 mm
Number of penetration: 5000 hits The evaluation of the positional accuracy of a perforated hole (hereinafter, referred to as hole-position accuracy) was performed in the lowermost one (i.e., 7th board) of the seven of stacked printed-wiring boards after 5000 hits (hereinafter, referred to as drilling 5000 holes). Specifically, errors in distance between the respective hole centers in 5000 of the hit holes were measured, and the maximum value thereof was calculated. When the maximum value was less than 40 µm, in the range of 40 µm to less than 50 µm, in the range of 50 µm to less than 60 µm, and 60 µm or more, the hole-position accuracy was evaluated as ♦, ○, Δ, and ×, respectively.

The evaluation of the surface roughness of the inner wall of the perforated hole (hereinafter, referred to as inner-wall roughness) was performed in the 5th board from the uppermost board. The surface roughnesses on the right and left sides of each of the inner walls of a through-hole corresponding to 4000th hit and two through-holes (hereinafter, referred to as drilled hole) corresponding to ones just before and after 4000th hit were measured, and an average values thereof was calculated. When the average value was less than 10 µm, less than 12.5 µm, less than 15.0 µm, and 17.5 or more, the inner-wall roughness was evaluated as ♦, ○, Δ, and ×, respectively.

The evaluation of the protect against breakage of the drill (hereinafter, referred to as drill-breakage protection) was evaluated based on whether the drill was broken during the drilling tests performed under the above conditions. When the drill was not broken until 5000 hits, the drill-breakage protection was evaluated as ♦. Further, when the drill was broken between 4000 hits and 4999 hits, between 3000 hits and 3999 hits, and before 3000 hits, the drill-breakage protection was evaluated as ○, Δ, and ×, respectively. In the above evaluations for Inventive examples, Comparative Examples and Referential Examples, the hole-position accuracy and the inner-wall roughness were evaluated on the basis of the time point when the drill was broken.

The evaluation of the transfer/adhesion behavior of the film (e.g., surface tackiness/blocking) was performed by stacking an aluminum plate (i.e., no covering film) having a square shape of 10 cm×10 cm, on a resin-coated metal plate cut to have the same shape as that of the aluminum plate, in such a manner that the aluminum plate is brought into contact with the resin film of the resin-coated metal plate, placing 50 kg of weight on the aluminum plate, leaving them under an atmosphere having a relative humidity of 80% at 40° C. for 12 hours. When neither the transfer of the resin film to the non-coated aluminum plate nor the adhesion between the aluminum plate and the metal plate was observed, the transfer/adhesion behavior was evaluated as ♦. When a part of the resin film was transferred, but no adhesion between the aluminum plate and the metal plate was observed, the transfer/adhesion behavior was evaluated as ○. When the entire resin film was transferred, or the adhesion between the aluminum plate and the metal plate was observed but plates were releasable, the transfer/adhesion behavior was evaluated as Δ. Further, when the aluminum plate and the metal plate unreleasably adhere to one another (i.e., occurrence of blocking), the transfer/adhesion behavior was evaluated as ×.

These test results are shown in Tables 2 to 4.

TABLE 2

| No. | Resin Code | Film Thickness (µm) | Plate Thickness (µm) | Drilling Condition | Hole Position | Inner wall | Drill Breakage Protection | Transfer/Adhesion |
|---|---|---|---|---|---|---|---|---|
| 1 | A | 100 | 100 | 1 | ○ | ○ | ○ | ♦ |
| 2 | A | 100 | 100 | 2 | ♦ | ♦ | ♦ | ♦ |
| 3 | B | 100 | 100 | 1 | ♦ | ♦ | ♦ | ♦ |
| 4 | B | 100 | 100 | 2 | ♦ | ♦ | ♦ | ♦ |
| 5 | C | 100 | 100 | 1 | ○ | ♦ | ♦ | ○ |
| 6 | C | 100 | 100 | 2 | ○ | ♦ | ♦ | ○ |
| 7 | D | 100 | 100 | 1 | ○ | ○ | ○ | ♦ |
| 8 | D | 100 | 100 | 2 | ○ | ♦ | ○ | ♦ |
| 9 | E | 100 | 100 | 1 | ♦ | ♦ | ♦ | ♦ |
| 10 | E | 100 | 100 | 2 | ♦ | ♦ | ♦ | ♦ |
| 11 | F | 100 | 100 | 1 | ○ | ○ | ○ | ○ |
| 12 | F | 100 | 100 | 2 | ○ | ♦ | ♦ | ○ |
| 13 | G | 100 | 100 | 1 | ○ | ○ | ○ | ♦ |
| 14 | G | 100 | 100 | 2 | ○ | ♦ | ♦ | ♦ |
| 15 | A | 20 | 100 | 2 | ○ | Δ | Δ | ♦ |
| 16 | A | 25 | 100 | 2 | ○ | ○ | ○ | ♦ |
| 17 | A | 50 | 100 | 2 | ♦ | ♦ | ♦ | ♦ |
| 18 | A | 150 | 100 | 2 | ♦ | ♦ | ♦ | ♦ |
| 19 | A | 200 | 100 | 2 | ♦ | ♦ | ♦ | ♦ |
| 20 | A | 250 | 100 | 2 | ○ | ♦ | ○ | ♦ |
| 21 | A | 300 | 100 | 2 | Δ | Δ | Δ | ♦ |
| 22 | A | 100 | 20 | 2 | Δ | Δ | Δ | ♦ |
| 23 | A | 100 | 50 | 2 | ○ | ○ | ○ | ♦ |
| 24 | A | 100 | 70 | 2 | ♦ | ♦ | ♦ | ♦ |

TABLE 2-continued

| No. | Resin Code | Film Thickness (μm) | Plate Thickness (μm) | Drilling Condition | Hole Position | Inner wall | Drill Breakage Protection | Transfer/ Adhesion |
|---|---|---|---|---|---|---|---|---|
| 25 | A | 100 | 150 | 2 | ◆ | ◆ | ◆ | ◆ |
| 26 | A | 100 | 200 | 2 | ◆ | ◆ | ◆ | ◆ |
| 27 | A | 100 | 250 | 2 | ○ | ◆ | ○ | ◆ |
| 28 | A | 100 | 300 | 2 | ○ | Δ | Δ | ◆ |

As shown in Table 2, it was verified that the test sample Nos. 1 to 28 encompassed within the scope of the present invention exhibit positive effects of significantly improving the hole-position accuracy, the inner-wall roughness in a through-hole (i.e., drilled hole) and the drill-breakage protection, during a perforating process using a drill, and the transfer/adhesion behavior (i.e., surface tackiness/blocking) due to moisture absorption or melting in the resin film formed on the aluminum plate.

The above positive effects will be described in more detail below. The test sample Nos. 1 to 14 have covering films made of various resins. Among them, the test sample Nos. 1, 3, 5, 7, 9, 11 and 13 were perforated under high-density drilling conditions (i.e., Condition 1). While all of these test samples provided an excellent drilling performance, it was observed that the inner-wall roughness and the drill-breakage protection in the test sample Nos. 1, 7, 11 and 13 having a melt viscosity close to its upper limit were apt to be slightly deteriorated under the high-density drilling conditions.

The resin A of the test sample Nos. 1 and 2 has a relatively high value in its hardness and melt viscosity even falling within the range defined in the present invention. Therefore, it was observed that the hole-position accuracy, the inner-wall roughness and the drill-breakage protection in the test sample No. 1 was apt to be slightly deteriorated under the high-density drilling conditions (i.e., Condition 1). The test sample Nos. 3, 4, 9 and 10 having a resin with properties falling within the preferable ranges defined in the present inventions provided a particularly excellent drilling performance even in the high-density drilling conditions. In the test sample Nos. 5 and 6, a slight adhesion between metal plates occurred when they were laminated and pressed, due to their resin having a melting point close to its lower limit, and the hole-position accuracy was apt to be slightly deteriorated due to their resin having a hardness close to its upper limit. It was observed that the lubrication during drilling in the test sample No. 7 and 8 having a resin with a melting point and melt viscosity close to their upper limits was apt to be slightly insufficient to cause slight deterioration in the inner-wall roughness. The test sample Nos. 11 and 12 having a resin with a harness close to its lower limit caused a slight adhesion. The hole-position accuracy in the test sample Nos. 13 and 14 having a resin with a harness close to its upper limit was apt to be slightly deteriorated.

The test sample Nos. 15 to 21 have resin films different in thickness. While all of these test samples provided an excellent drilling performance, the test samples having a film thickness ranging from 25 μm to 250 μm exhibited a further enhanced performance, and the test samples having a film thickness ranging from 50 μm to 200 μm exhibited a particularly remarkable improvement in the performance.

The test sample Nos. 22 to 28 have aluminum plates different in thickness. While all of these test samples provided an excellent drilling performance, the test samples having a plate thickness ranging from 50 μm to 250 μm exhibited a further enhanced performance, and the test samples having a plate thickness ranging from 70 μm to 200 μm exhibited a particularly remarkable improvement in the performance.

Differently from the results shown in Table 2, none of Comparative Examples deviated from the scope of the present invention met all of the intended performances and cost-effectiveness. The results are shown in Table 3.

TABLE 3

| No. | Resin Code | Film Thickness (μm) | Plate Thickness (μm) | Drilling Condition | Hole Position | Inner wall | Drill Breakage Protection | Transfer/ Adhesion |
|---|---|---|---|---|---|---|---|---|
| 29 | H | 100 | 100 | 1 | X | X | X | ◆ |
| 30 | H | 100 | 100 | 2 | X | X | Δ | ◆ |
| 31 | I | 100 | 100 | 1 | X | Δ | X | X |
| 32 | I | 100 | 100 | 2 | Δ | ○ | ○ | X |
| 33 | J | 100 | 100 | 1 | X | Δ | ○ | Δ |
| 34 | J | 100 | 100 | 2 | X | Δ | X | Δ |
| 35 | K | 100 | 100 | 1 | X | ○ | X | Δ |
| 36 | K | 100 | 100 | 2 | Δ | ○ | Δ | Δ |
| 37 | L | 100 | 100 | 2 | ○ | ○ | ○ | X |
| 38 | M | 100 | 100 | 2 | ○ | X | X | ◆ |

The test sample Nos. 29 to 38 have covering films made of various resins. Among them, the test sample Nos. 29 and 30 having a resin with a hardness and melt viscosity beyond the ranges defined in the present invention had deteriorated hole-position accuracy and inner-wall roughness, and involved the risk of breakage of a drill.

The test sample Nos. 31 and 32 having a film made of a water-soluble resin caused the adhesion between metal plates (i.e., blocking) when they were laminated and pressed, and a bending or warping while locating the resin-coated surface on the inside or on the side of a printed-wiring board. This requires taking particular measures during storage or transportation, resulting in significant deterioration in operating performance and economical efficiency. Moreover, due to the resin with a melt viscosity lower than the lower limit defined in the present invention, the molten resin attached to a drill dropped onto the resin-coated metal plate as a foreign object, particularly in the high-density drilling conditions, to significantly deteriorate the hole-position accuracy and induce the breakage of the drill.

The lubrication in test sample Nos. 33 and 34 became insufficient to cause deteriorations in the hole-position accuracy and inner-wall roughness, and increased risk of breakage of a drill, due to its resin with a melt viscosity higher than the upper limit defined in the present invention, under a shear rate of 3000 mm/sec.

In the test sample Nos. 35 and 36 having a resin with a melt viscosity lower than the lower limit defined in the present invention, under a shear rate of 200 mm/sec, resin components attached to a drill was liable to remain around a perforated hole so as to deteriorate the hole-position accuracy and the drill-breakage protection.

The test sample No. 37 having a resin with a melting point and hardness lower than the lower limits defined in the present invention caused the adhesion between metal plates (i.e., blocking) when they were laminated and pressed. The lubrication in the test sample No. 38 having a resin with a melting point higher than the upper limit defined in the present invention became insufficient to deteriorate the inner-wall roughness and the drill-breakage protection.

Referential Examples were prepared using a resin falling within the ranges defined in the present invention while changing the thickness of the resin film or the aluminum plate. The test results are shown in Table 4.

TABLE 4

| No. | Resin Code | Film Thickness (μm) | Plate Thickness (μm) | Drilling Condition | Hole Position | Inner wall | Drill Breakage Protection | Transfer/ Adhesion |
|---|---|---|---|---|---|---|---|---|
| 39 | A | 10 | 100 | 2 | ○ | Δ | ○ | ♦ |
| 40 | A | 350 | 100 | 2 | Δ | ○ | ○ | ♦ |
| 41 | A | 100 | 10 | 2 | Δ | ○ | ○ | ♦ |
| 42 | A | 100 | 350 | 2 | ○ | ○ | ○ | ♦ |

The test sample Nos. 39 and 40 were prepared by changing the thickness of the resin film. These samples showed sufficient practical usefulness as a cover plate for used in a perforating process, because they exhibited excellent drill-breakage protection without any surface tackiness and adhesion. However, the test sample No. 39 having a resin film with a relatively small thickness exhibited slightly insufficient lubrication to induce slightly deteriorated inner-surface accuracy. In the sample No. 40, the straight movement or penetration of a drill was slightly spoiled due to its resin film with a relatively large thickness, and a slight deterioration of hole-position accuracy was observed.

The test sample Nos. 41 and 42 were prepared by changing the thickness of the aluminum base plate. These samples exhibited excellent drill-breakage protection without any surface tackiness and adhesion. However, the test sample No. 41 having a base plate with a relatively small thickness was likely to be unable to prevent chips from entering between the resin-coated metal plate and a printed-circuit board, so as to cause slight deterioration in hole-position accuracy. On the other hand, the test sample No. 42 having a base plate with a relatively large thickness requires a larger amount of aluminum per unit area which leads to increase in cost.

As seen in the above test results, it was proved that, while the resin-coated metal plates using a resin having the properties falling with the scope of the present invention are slightly different in effect, they exhibit a significantly excellent performance as a cover plate for use in perforating a printed-wiring board, as compared with at least a conventional metal plate departing from the scope of the present invention.

As described above, an inventive resin-coated metal plate comprises a metal base plate, and a film made of a thermoplastic resin and formed on at least one of the opposite surfaces of said metal base plate to cover thereover, said thermoplastic resin being substantially water-insoluble, wherein said thermoplastic resin has: a melting peak temperature ranging from 60° C. to 120° C., according to the measurement based on JIS K7121; a melt viscosity ranging from $1\times10^3$ P to $1\times10^4$ P under a shear rate of 200 mm/sec, and from $5\times10^2$ P to $5\times10^3$ P under a shear rate of 3000 mm/sec, in the state when said thermoplastic resin is molten at 150° C.; and a durometer D hardness ranging from 20 to 45, according to the measurement based on JIS K7215.

In the resin-coated metal plate of the present invention, the thermoplastic resin film is preferred to have a thickness ranging from 20 μm to 300 μm. This range is determined on the ground that the film having a thickness of less than 20 μm is likely to have difficulties in obtaining the intended lubricating performance or chip-discharging performance, and the film having a thickness of greater than 300 μm is likely to cause deterioration in the positional accuracy of a perforated hole or breakage of a drill. Further, the metal base plate is preferred to have a thickness ranging from 20 μm to 300 μm. This range is determined on the ground that the base plate having a thickness of less than 20 μm is likely to cause deterioration in the positional accuracy of a perforated hole during perforating or accumulation of chips between the printed-wiring board and the resin-coated metal plate, and the base plate having a thickness of greater than 300 μm has poor cost-effectiveness.

In the resin-coated metal plate of the present invention, the metal base plate also may be formed of an aluminum plate or an aluminum alloy plate. These materials are suitable for a cover plate because they have an appropriate level of hardness and strength. The thermoplastic resin film may be laminated on the metal base plate through either one selected from the group consisting of a dry laminating process, a wet laminating process and a hot laminating process. According to these processes, the thickness of the thermoplastic resin film can be readily controlled.

It is another object of the present invention to provide a method of producing a printed-wiring board using the resin-coated metal plate.

According to another aspect of the present invention, a printed-wiring board production method comprises a step of perforating a workpiece consisting of a single printed-wiring board or a plurality of laminated printed-wiring boards, with a drill, while placing as a protective cover plate the above resin-coated metal plate, on at least a drill entry surface of the workpiece.

In a process of perforating a printed-wiring board with a drill, the resin-coated metal plate of the present invention can be placed on at least a drill entry surface of a workpiece consisting of a single printed-wiring board or a plurality of laminated printed-wiring boards, as a protective cover plate, so as to effectively prevent heat generation in the drill to provide an extended life of the drill and reduce the risk of breakage of the drill. In addition, the resin-coated metal plate allows a perforated hole to be formed with enhanced smoothness of its inner wall and excellent positional accuracy so as to produce a high-quality printed-wiring board. In particular, even under severe drilling conditions where the distance (pitch) between adjacent perforated holes currently becomes narrower in conjunction with densification in printed-wiring board packaging, the resin-coated metal plate of the present invention can maintain the quality of a perforated hole at a high level. Moreover, the film in the resin-coated metal plate of the present invention is reduced in surface tackiness. This prevents a plurality of resin-coated metal plates from disadvantageously adhering to each other during storage or transportation thereof so as to provide excellent operation performance and storage stability.

More specifically, in the resin-coated metal plate of the present invention, the thermoplastic resin film having an appropriate level of melting point, melt viscosity and hardness can facilitate the straight movement or penetration of a drill. Further, the thermoplastic resin film can absorb frictional heat generated during drilling in conjunction of melting thereof, and attach onto the drill to effectively lubricate the drill along with penetration of the drill.

Also, chips resulting from drilling are discharged from a perforated hole through grooves of the drill together with the molten thermoplastic resin. Thus, a raised portion, which would otherwise be formed around a perforated hole formed in the resin-coated metal plate, is reduced to thereby provide an additional effect of allowing an adjacent hole to be perforated at an intended position without obstruction.

Based on the combination of the above effects, even under particularly severe drilling conditions increasing in late years, or conditions where a plurality of through-holes are perforated at a narrow distance between adjacent perforated holes (i.e., at a narrow hole pitch) or in a high density, the resin-coated metal plate of the present invention can be used to prevent the occurrence of deep cracks or severe fracture in glass fibers, phenol resin, epoxy resin, copper sheet, paper or the like, serving as a primary component of a printed-wiring board, and to obtain a through-hole having excellent positional accuracy and surface smoothness in its inner wall while reducing the wearing of a drill and facilitating the discharge of chips.

As above, the resin-coated metal plate of the present invention capable of bringing out an excellent performance as a cover plate for use in perforating a printed-wiring board is significantly valuable in terms of industrial usefulness.

This application is based on Japanese patent application serial No. 2003-410779, filed in Japan Patent Office on Dec. 9, 2003, the contents of which are hereby incorporated by reference.

Although the present invention has been fully described by way of example, it is to be understood that various changes and modifications will be apparent to those skilled in the art. Therefore, unless otherwise such changes and modifications depart from the scope of the present invention hereinafter defined, they should be construed as being included therein.

What is claimed is:

1. A resin-coated metal plate for use in perforating a printed-wiring board, comprising:
    a metal base plate and a thermoplastic resin film comprising a thermoplastic resin, the thermoplastic resin film being formed on at least one of opposite surfaces of said metal base plate so as to cover thereover,
    said thermoplastic resin being substantially water-insoluble,
    wherein said thermoplastic resin is a resin showing a melting peak and is at least one selected from the group consisting of an ethylene-ethyl acrylate copolymer resin, an ethylene-vinyl acetate copolymer resin and an ethylene-methacrylate copolymer resin, and wherein said thermoplastic resin has:
    a melting peak temperature measured according to JIS K7121 ranging from 60° C. to 100° C.;
    a melt viscosity ranging from $1 \times 10^3$ poise to $1 \times 10^4$ poise under a shear rate of 200 mm/sec, and from $5 \times 10^2$ poise to $5 \times 10^3$ poise under a shear rate of 3000 mm/sec, in the state when said thermoplastic resin is molten at 150° C.

2. The resin-coated metal plate according to claim 1, said thermoplastic resin having a durometer D hardness measured according to JIS K7215 ranging from 20 to 45, and said thermoplastic resin film has a thickness ranging from 20 μm to 300 μm.

3. The resin-coated metal plate according to claim 1, said thermoplastic resin further comprising an ethylene-acrylic acid copolymer resin.

4. The resin-coated metal plate according to claim 3, said thermoplastic resin having a durometer D hardness measured according to JIS K7215 ranging from 20 to 45, and said thermoplastic resin film has a thickness ranging from 20 μm to 300 μm.

5. A resin-coated metal plate for use in perforating a printed-wiring board, comprising:
    a metal base plate and a thermoplastic resin film comprising a thermoplastic resin, the thermoplastic resin film being formed on at least one of opposite surfaces of said metal base plate so as to cover thereover,
    said thermoplastic resin being substantially water-insoluble,
    wherein said thermoplastic resin is a resin showing a melting peak and is at least one selected from the group consisting of an ethylene-ethyl acrylate copolymer resin, an ethylene-vinyl acetate copolymer resin and an ethylene-methacrylate copolymer resin, and wherein said thermoplastic resin has:
    a melting peak temperature measured according to JIS K7121 ranging from 60° C. to 100° C.;
    a melt viscosity ranging from $1 \times 10^3$ poise to $1 \times 10^4$ poise under a shear rate of 200 mm/sec, and from $5 \times 10^2$ poise to $5 \times 10^3$ poise under a shear rate of 3000 mm/sec, in the state when said thermoplastic resin is molten at 150° C.; and
    a durometer D hardness measured according to JIS K7215 ranging from 20 to 45, and said thermoplastic resin film has a thickness ranging from 20 μm to 300 μm.

6. The resin-coated metal plate according to claim 5, wherein said metal base plate has a thickness ranging from 20 μm to 300 μm.

7. The resin-coated metal plate according to claim 5, wherein said metal base plate is formed of an aluminum plate or an aluminum alloy plate.

8. The resin-coated metal plate according to claim 5, wherein said thermoplastic resin film is laminated on said metal base plate through either one process selected from the group consisting of a dry laminating process, a wet laminating process and a hot laminating process.

9. A resin-coated metal plate for use in perforating a printed-wiring board, comprising:
    a metal base plate and a thermoplastic resin film comprising a thermoplastic resin, the thermoplastic resin film being formed on at least one of opposite surfaces of said metal base plate so as to cover thereover, said thermoplastic resin being substantially water-insoluble, wherein said thermoplastic resin is a resin showing a melting peak and comprises an ethylene-acrylic acid copolymer resin, and wherein said thermoplastic resin has:

a melting peak temperature measured according to JIS K7121 ranging from 60° C. to 100° C.;

a melt viscosity ranging from $1 \times 10^3$ poise to $1 \times 10^4$ poise under a shear rate of 200 mm/sec, and from $5 \times 10^2$ poise to $5 \times 10^3$ poise under a shear rate of 3000 mm/sec, in the state when said thermoplastic resin is molten at 150° C.; and a durometer D hardness measured according to JIS K7215 ranging from 20 to 45, and said thermoplastic resin film has a thickness ranging from 20 μm to 300 μm.

10. A resin-coated metal plate for use in perforating a printed-wiring board, comprising:

a metal base plate and a thermoplastic resin film comprising a thermoplastic resin, the thermoplastic resin film being formed on at least one of opposite surfaces of said metal base plate so as to cover thereover, wherein said thermoplastic resin is a resin showing a melting peak and comprises an ethylene-vinyl acetate copolymer resin and an ethylene-acrylic acid copolymer resin, and wherein said thermoplastic resin has:

a melting peak temperature measured according to JIS K7121 ranging from 60° C. to 100° C.;

a melt viscosity ranging from $1 \times 10^3$ poise to $1 \times 10^4$ poise under a shear rate of 200 mm/sec, and from $5 \times 10^2$ poise to $5 \times 10^3$ poise under a shear rate of 3000 mm/sec, in the state when said thermoplastic resin is molten at 150° C.

11. The resin-coated metal plate according to claim 10, said thermoplastic resin having a durometer D hardness measured according to JIS K7215 ranging from 20 to 45, and said thermoplastic resin film has a thickness ranging from 20 μm to 300 μm 12. The resin-coated metal plate according to claim 10, said thermoplastic resin further comprising at least one of an ethylene-ethyl acrylate copolymer resin and an ethylene-methacrylate copolymer resin.

13. The resin-coated metal plate according to claim 12, said thermoplastic resin having a durometer D hardness measured according to JIS K7215 ranging from 20 to 45, and said thermoplastic resin film has a thickness ranging from 20 μm to 300 82 m 14. A method of producing a printed-wiring board, comprising the step of perforating a workpiece consisting of a single printed-wiring board or a plurality of laminated printed-wiring boards, with a drill, while placing as a protective cover plate the resin-coated metal plate according to claim 5, on at least a drill entry surface of said workpiece.

* * * * *